United States Patent
Paul et al.

(10) Patent No.: US 10,838,031 B2
(45) Date of Patent: Nov. 17, 2020

(54) IMAGE QUALITY IN DIXON TURBO SPIN ECHO SEQUENCES

(71) Applicant: Siemens Healthcare GmbH, Erlangen (DE)

(72) Inventors: Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/199,450

(22) Filed: Nov. 26, 2018

(65) Prior Publication Data
US 2019/0162809 A1 May 30, 2019

(30) Foreign Application Priority Data
Nov. 27, 2017 (DE) ........................ 10 2017 221 154

(51) Int. Cl.
| | |
|---|---|
| *G01R 33/565* | (2006.01) |
| *G01R 33/54* | (2006.01) |
| *G01R 33/48* | (2006.01) |
| *G01R 33/561* | (2006.01) |

(52) U.S. Cl.
CPC ... *G01R 33/56545* (2013.01); *G01R 33/4828* (2013.01); *G01R 33/543* (2013.01); *G01R 33/4818* (2013.01); *G01R 33/5617* (2013.01)

(58) Field of Classification Search
CPC ............ G01R 33/56545; G01R 33/543; G01R 33/4828; G01R 33/5617; G01R 33/4818
See application file for complete search history.

(56) References Cited

U.S. PATENT DOCUMENTS

| | | | |
|---|---|---|---|
| 6,420,870 B1 | 7/2002 | Kiefer | |
| 6,466,014 B1* | 10/2002 | Ma | G01R 33/4828 324/307 |
| 2009/0001984 A1* | 1/2009 | Hwang | G01R 33/5611 324/307 |
| 2009/0134871 A1* | 5/2009 | Yui | G01R 33/5614 324/309 |
| 2016/0033606 A1* | 2/2016 | Eggers | G01R 33/36 324/309 |
| 2016/0041249 A1 | 2/2016 | Lee et al. | |

\* cited by examiner

*Primary Examiner* — Akm Zakaria
(74) *Attorney, Agent, or Firm* — Schiff Hardin LLP

(57) ABSTRACT

In a magnetic resonance (MR) method and apparatus, first and second MR data are acquired from respective echo trains with gradient moments of one echo train being in a sequence that is an inversion of at least a portion of the sequence of gradient moments in the second echo train. The MR signals are acquired from at least two substances in a volume of a subject, so that the relaxation of the respective nuclear spins influences the manner by which the first and second data are entered into k-space, so that when an image is reconstructed, the filter effect induced by such relaxation is compensated for.

11 Claims, 8 Drawing Sheets

FIG 4
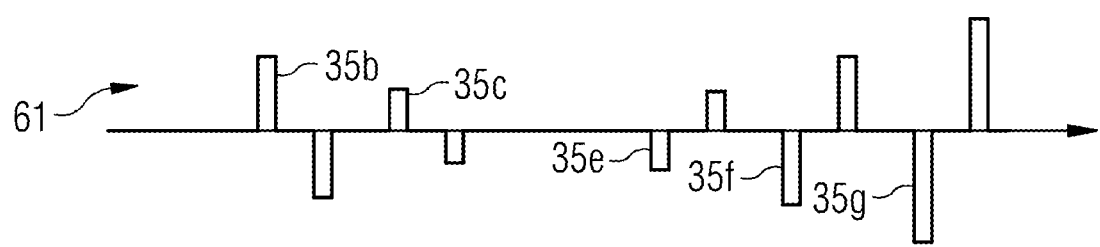
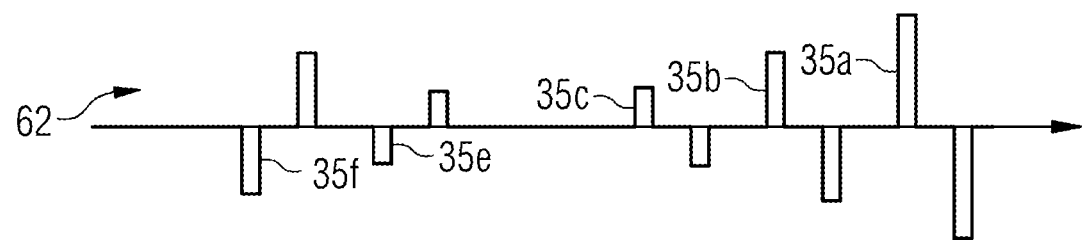

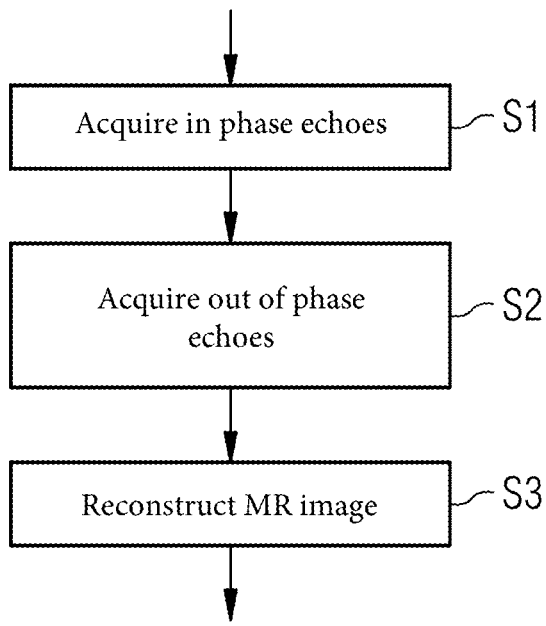

IMAGE QUALITY IN DIXON TURBO SPIN ECHO SEQUENCES

BACKGROUND OF THE INVENTION

Field of the Invention

The present invention concerns Dixon Turbo Spin Echo sequences, used in magnetic resonance (MR) imaging, in which the image quality of the MR images reconstructed from these sequences is improved compared with MR images that have been acquired on the basis of a Dixon Turbo Spin Echo sequence acquired according to the prior art.

Description of the Prior Art

In Fast Spin Echo sequences (also known as Turbo Spin Echo, Fast Spin Echo), a number of echoes or k-space lines are acquired in one echo train. The signal strength of the echoes diminishes exponentially within an echo train according to the function e−t/T2 (with T2 being the spin-spin relaxation time or transverse relaxation time). This means that the echoes at the beginning of an echo train clearly have more signal than the echoes at the end of the same echo train. In other words, the signal strength causes an exponential decline along the echo train.

This may (as a function of the parameterization protocol) lead to a marked lack of sharpness, due to the corresponding spread of the "Point Spread" function. With certain Spin Echo sequences, such as HASTE (Half Fourier Acquisition Single Shot Turbo Spin Echo), this lack of sharpness is a limiting factor because of the very long echo train length due to the high turbo factor of these sequences.

With Dixon Turbo Spin Echo sequences as well, this lack of sharpness can be seen clearly, due to the very long echo to echo space (echo spacing or ESP) of these sequences.

SUMMARY OF THE INVENTION

An object of the present invention is to improve the image sharpness in particular with Dixon Turbo Spin Echo sequences compared with Dixon Turbo Spin Echo sequences according to the prior art.

In the context of the present invention, a method for acquiring MR data in a predetermined volume segment of an examination subject by the operation of an MR scanner of an MR apparatus includes the following steps:

First MR data are acquired that relate to the predetermined volume segment of an examination subject with a first echo train. The first MR data are acquired during this first echo train in each case at time intervals during which nuclear spins of two predetermined substances inside the volume segment are in phase. Gradient moments of a phase-encoding gradient of the first echo train in a (first) phase-encoding direction correspond, with respect to their chronological sequence in which they occur during the first echo train, with a first predetermined sequence of gradient moments.

To acquire the first MR data in the first echo train, an RF excitation pulse is generated, which is followed by a plurality of RF refocusing pulses. After each RF refocusing pulse, an echo or a k-space line is acquired. The position of this k-space line is determined from the respective gradient moment of the phase-encoding gradient of the first echo train, which moment is generated after the respective RF refocusing pulse and before acquiring the respective echo.

Second MR data are acquired that relate to the predetermined volume segment with a second echo train. The second MR data is acquired during this second echo train in each case at time intervals during which the nuclear spins of the two predetermined substances inside the volume segment differ by 180° with respect to their phase. The gradient moments of the phase-encoding gradient of the second echo train in the (first) phase-encoding direction correspond, with respect to their chronological sequence in which they occur during the second echo train, with a second predetermined sequence of gradient moments.

As with the first echo train, to acquire the second MR data relating to the second echo train, an RF excitation pulse is applied, which is followed by a number of RF refocusing pulses. After each RF refocusing pulse, an echo or a k-space line is acquired. The position of this k-space line is determined from the respective gradient moment of the phase-encoding gradient of the second echo train, which moment is generated after the respective RF refocusing pulse and before acquiring the respective echo of the second echo train.

An MR image (image data) is reconstructed from the echoes or of the MR data relating to the first echo train and the echoes or MR data relating to the second echo train. The echoes or the MR data relating to the first echo train are combined with the echoes or MR data relating to the second echo train in order to reconstruct the MR image using these combined echoes or MR data. In this combination of the echoes or MR data, an echo (MR data) relating to the first echo train is combined in each case with an echo or MR data relating to the second echo train, in which the respective gradient moment of the phase-encoding gradient (of the first echo train and the second echo train) that is applied in each case is the same.

The second sequence of gradient moments in the second echo train corresponds with a partial or complete inversion of the first sequence of gradient moments in the first echo train, such that the first gradient moment in the second sequence corresponds with the nth gradient moment in the first sequence, the second gradient moment in the second sequence corresponds with the (n−1)th gradient moment in the first sequence, the third gradient moment in the second sequence corresponds with the (n−2)th gradient moment in the first sequence, and so on. In other words, partial inversion is understood to mean that the following equation (1) is true for the first n gradient moments $GM_2(1)$ to $GM_2(n)$ in the second sequence (that is, for i=1 to n):

$$GM_2(i)=GM_1(n-i+1) \tag{1}$$

Here n is governed by the following inequality (2).

$$EZL \geq n \geq 2 \tag{2}$$

Here EZL equals the echo train length (that is, the number of echoes recorded per echo train) in the first and the second echo train, which again means that the echo train length of the first echo train is equivalent to the echo train length of the second echo train.

Through the partial or complete inversion of the first sequence of the gradient moments in the first echo train compared with the second sequence of the gradient moments in the second echo train, the relaxation (more precisely T2 relaxation) or reduction in the signal strength for the first echo train influences the filtering of k-space differently than for the second echo train. In other words, the relaxation due to the inversion influences the determination of k-space values in different ways when using the first echo train and when using the second echo train. By combining the echoes of the two echo trains for which the respective gradient moment is the same with regard to area and algebraic sign, the filter effect induced by the relaxation is virtually compensated for and is hence advantageously reduced, compared with two echo trains in which the sequences of gradient moments are not (partially) inverted with each other.

Both with the first and with the second echo train, k-space is scanned (filled with data) in a specific selection direction. Since neither the first nor the second echo train scans a k-space region (for example, a k-space line) twice, it is ensured that neither a partial nor a complete inversion of the first (second) echo train again corresponds with the same first (second) echo train.

In a preferred embodiment of the invention, k-space is subdivided into slice segments, which are preferably of equal size. Here, a dimension of each of these slice segments in the selection gradient direction corresponds with the dimension of k-space, such that the quantity of all the slice segments that are adjacent to each other in the phase-encoding direction form a slice of k-space. In this embodiment, the first echo train and/or the second echo train are only echoes or MR data from some of the slice segments, which are adjacent to each other in the phase-encoding direction (that is, have the same coordinates in the z-direction of k-space). The echoes or the MR data from those slice segments from which no echoes or MR data are acquired by the echo train can be constructed at the latest for the reconstruction of the MR image using the echoes or MR data. Such a procedure is also known as a Partial Fourier or Half Fourier.

By echoes or MR data not being acquired from each of the slice segments in a k-space slice by the first and/or second echo train, advantageously the time for acquiring the MR data can be shortened compared with a procedure in which echoes or MR data are acquired from all slice segments. It is important according to the invention that there exist, in particular in the center of the corresponding k-space slice, at least some slice segments in which both the first and the second echo train acquires a relevant echo or MR data.

According to a different embodiment of the invention, the partial inversion is a complete inversion. In the complete inversion, the first gradient moment in the second sequence corresponds with the last gradient moment in the first sequence, the second gradient moment in the second sequence corresponds with the penultimate gradient moment in the first sequence, the third gradient moment in the second sequence corresponds with the third to last gradient moment in the first sequence, and so on. In other words, the gradient moments GM2 in the second sequence are governed by the following equation (3) (for all instances of i from 1 to EZL).

$$GM_2(i)=GM_1(EZL-i+1) \qquad (3)$$

Complete inversion is used when both the first and the second echo train acquire an echo or MR data from each slice segment. Embodiments according to the invention that work with complete inversion usually require more time for acquiring the MR data than embodiments that work with partial inversion, but they advantageously scan k-space more accurately, as a result of which the reconstructed MR image is qualitatively of greater value.

The two predetermined substances can be water and fat. Another possibility is for at least one of the two substances to be silicon or a substance with a fluorine component.

Usually, according to the invention, echoes or MR data relating to the first and the second echo train are acquired from the same k-space slice. The following variants are provided for acquiring the MR data relating to the first and the second echo train.

Phase-Encoding in Two Directions.

While MR data are acquired by the first echo train or during the second echo train, the same further phase-encoding gradient is applied in a further phase-encoding direction, such that the first MR data and the second MR data are acquired at least partly from the same k-space lines. Here, the further phase-encoding direction is in particular perpendicular to the phase-encoding direction and the selection gradient direction. Hence the further phase-encoding direction corresponds in particular with the z-direction.

Slice Selection.

While MR data are acquired using the first echo train or during the second echo train, the same slice selection is enacted, such that the first MR data and the second MR data are acquired at least partly from the same k-space lines. For this slice selection, a slice selection gradient is applied in particular, in a direction (for example, the z-direction) which is perpendicular to the phase-encoding direction and the selection gradient direction.

Preferably, the first echo train has the same echo to echo space as the second echo train.

By having the echo to echo space in the first echo train correspond with the echo to echo space in the second echo train, the recording conditions when acquiring the first MR data and the recording conditions when acquiring the second MR data are essentially identical, which means that the filter effect described in the aforementioned can be better compensated for or reduced than would be the case if the two echo trains had different echo to echo spaces.

The present invention also encompasses a magnetic resonance apparatus having a magnetic resonance data acquisition scanner that includes a gradient coil arrangement operated by a gradient controller, a radio-frequency (RF) transmission antenna arrangement operated by an RF controller, an image sequence controller that defines the gradient pulses in the RF pulses emitted by the gradient coil arrangement and the RF transmission antenna, and a control computer that operates all of these components in order to implement the method according to the invention as described above. The magnetic resonance data acquisition scanner also includes an RF reception antenna arrangement, which may be the same as the RF transmission antenna arrangement.

The magnetic resonance scanner is operated to acquire first MR data relating to the predetermined volume segment using a first echo train. The first MR data are acquired during the first echo train in each case during time intervals, during which spins of two predetermined substances are in phase. Gradient moments of a phase-encoding gradient of the first echo train in one phase-encoding direction correspond with a first predetermined sequence. Furthermore, the magnetic resonance scanner is operated to acquire second MR data relating to the predetermined volume segment using a second echo train. During the second echo train, the second MR data are acquired in each case during time intervals during which the phase of the spins of one of the two predetermined substances differs by 180° from the phase of the spins of the other of the two predetermined substances. The gradient moments of a phase-encoding gradient of the second echo train in the phase-encoding direction are governed here by a second predetermined sequence. The computer of the MR apparatus is configured to reconstruct an MR image on the basis of the first and second MR data. The second sequence corresponds with a partial inversion of the first sequence, which means that the first gradient moment in the second sequence corresponds with the nth gradient moment in the first sequence, the second gradient moment in the second sequence with the (n−1)th gradient moment in the first sequence, the third gradient moment in the second sequence with the (n−2)th in the first sequence, and so on. Here n is smaller than or equal to the echo train length of the first echo train and the second echo train.

The advantages of the magnetic resonance apparatus according to the invention essentially correspond to the advantages of the method according to the invention as described above.

The present invention also encompasses a non-transitory, computer-readable data storage medium encoded with programming instructions that, when loaded into a computer or computer system of a magnetic resonance apparatus, cause the computer or computer system to operate the magnetic resonance apparatus so as to implement any or all embodiments of the method according to the invention, as described above.

The code can be a source code (C++ for example), which still has to be compiled and linked up or just has to be interpreted, or can be an executable software code that only needs to be loaded into the corresponding computer in order to execute the code.

With the present invention it is possible to generate MR images in which the two substances, which have different resonance frequencies, by compensating for the filtering due to the T2 relaxation, can be reconstructed with a better image sharpness than when acquiring MR data in which the second sequence does not correspond with any partial inversion of the first sequence.

BRIEF DESCRIPTION OF THE DRAWINGS

FIG. 4 shows gradient moments of two echo trains according to the invention over time, with the sequence of the first gradient moments corresponding to a partial inversion of the second gradient moments.

FIG. 8 is a flowchart of the method according to the invention for acquiring MR data and reconstructing an MR image based on the MR data that has been acquired.

DESCRIPTION OF THE PREFERRED EMBODIMENTS

Figure 1:
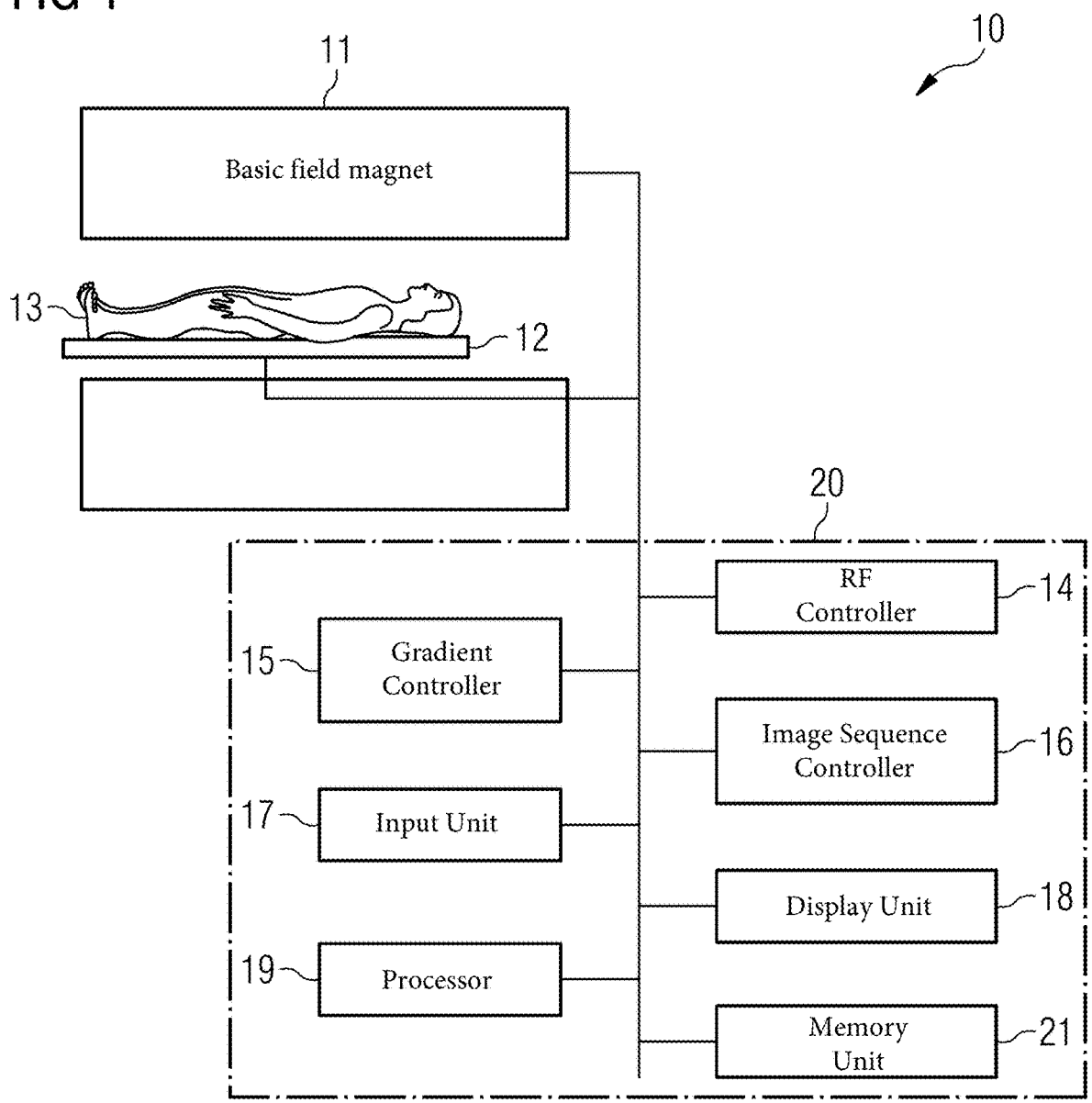
FIG. 1 shows a magnetic resonance apparatus according to the invention.

FIG. 1 shows a magnetic resonance scanner 10 with which MR data are acquired according to the invention, as explained below. The magnetic resonance scanner 10 comprises a basic field magnet 11 that generates a polarization field BO, with an examination subject 13 arranged on a table 12 being moved into the basic field magnet 11 in order to record spatially encoded magnetic resonance signals or MR data relating to the examination subject 13. The coils used for signal recording, such as a whole body coil or local coils, are not shown for clarity. By radiating radio frequency pulses and applying magnetic field gradients, the magnetization generated by the polarization field BO is deflected from the equilibrium position and spatially encoded, and the resulting magnetization being detected by the reception coils. Those skilled in the art know how MR images are generated by radiating radio frequency pulses and by applying magnetic field gradients in various combinations and sequences, so this need not be explained herein in further detail.

The magnetic resonance scanner 10 has a control computer 20, which controls the magnetic resonance scanner 10. The control computer 20 has a gradient controller 15 to control and apply the necessary magnetic field gradients. An RF controller 14 controls the generation of RF pulses for deflecting the magnetization. An image sequence controller 16 controls the sequence of magnetic field gradients and RF pulses and hence indirectly controls the gradient controller 15 and the RF controller 14. Via an input unit 17, an operator can control the magnetic resonance scanner 10 and MR images and other information necessary for control can be displayed on a display unit 18. A processor 19 is provided to control the various units in the control computer 20 and to carry out computations. Furthermore, a memory unit 21 is provided in which program modules or programs can be stored, which when run by the computer 20 or the processor unit 19, control the operation of the magnetic resonance scanner 10. The processor 19 is configured to calculate the MR images from the MR signals that have been acquired.

Figure 2:
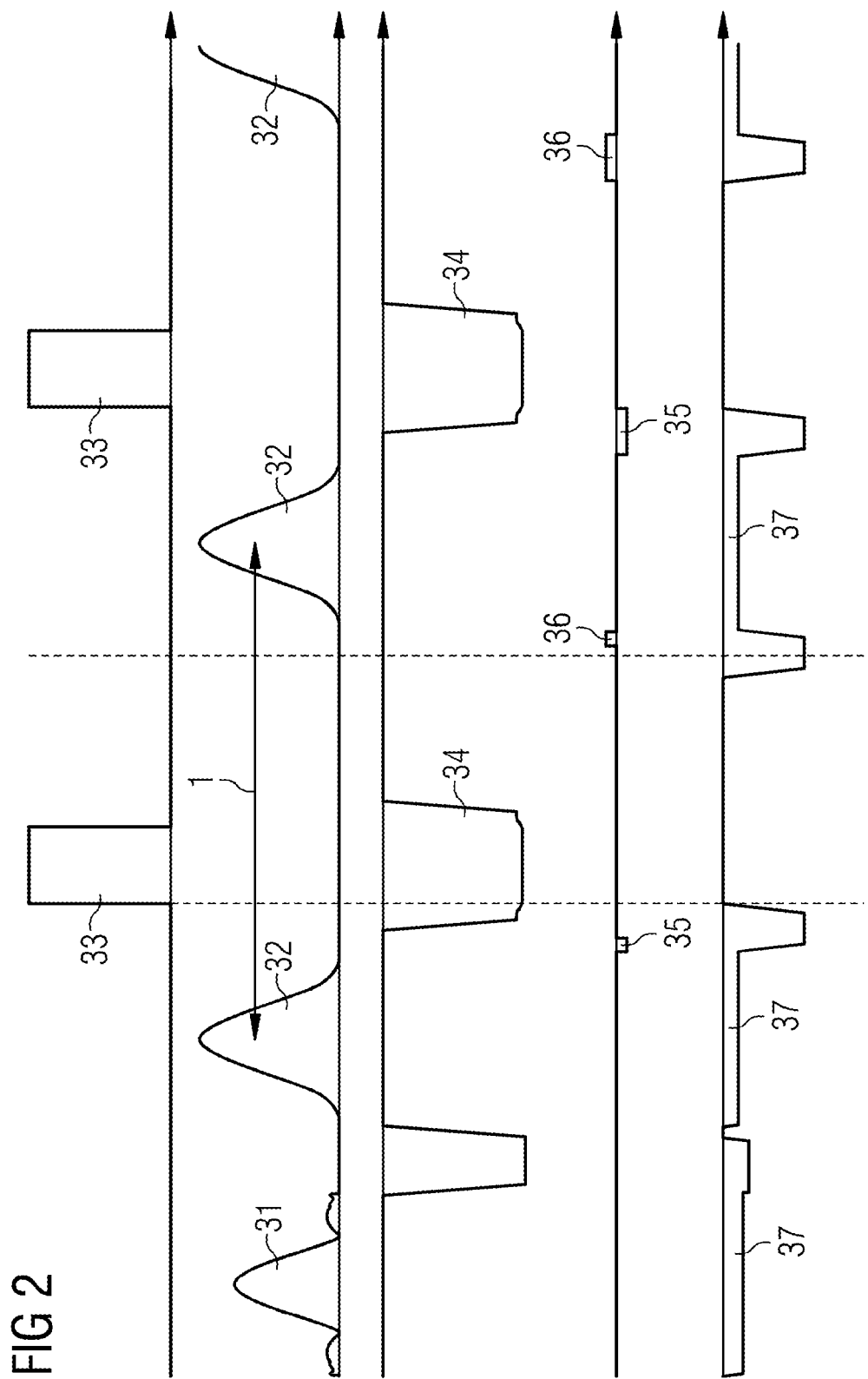
FIG. 2 shows a sequence according to the invention for acquiring MR data.

FIG. 2 shows a sequence according to the invention for acquiring MR data using an echo train. While a slice selection gradient 37 is applied in the z-direction, an RF excitation pulse 31 is radiated at the same time. Subsequently a refocusing pulse 32 is radiated while a slice selection gradient 37 is again applied. After the RF refocusing pulse 32, a phase-encoding gradient 35 is applied in the y-direction before a selection gradient 34 is applied in the x-direction in order to acquire MR data, which is indicated by the ADC signal 33.

After the selection gradient 34 and before the next RF refocusing pulse 32, a gradient 36 is applied in the phase-encoding direction or y-direction, the gradient moment of which nullifies the gradient moment generated by the phase-encoding gradient 35. The time interval 1 between two adjacent RF refocusing pulses 32 is the "echo to echo space", which also occurs between two adjacent selection gradients 34 and two adjacent ADC signals 33. The radiation of the RF refocusing pulse 32 when the slice selection gradient 37 is being applied, the application of the phase-encoding gradient 35, the selection of the MR data by means of the selection gradient 34 and the application of the gradient 36 occur repeatedly, so as to repeatedly select a different k-space line in each case. Therefore, with one echo train starting with precisely one RF excitation pulse 31, a number of k-space lines are scanned, by having an RF refocusing pulse 32 radiated in each case for each of these k-space lines.

On the basis of the time interval between the preceding RF refocusing pulse 32 and the selection gradient 34, it is decided whether MR data for an In Phase Image or MR data for an Out of Phase Image are acquired. When MR data are acquired for an In Phase Image, the spins of two predetermined substances are in phase at the time of scanning. When MR data are acquired for an Out of Phase Image, the phase of the spins of one of the predetermined substances is shifted by 180° compared with the phase of the spins of the other of the predetermined substances. Each echo train according to the invention acquires either only MR data for an In Phase Image or only MR data for an Out of Phase Image. However, the echo to echo space 1 for the echo trains according to the invention with which MR data are acquired for an In Phase Image is equal to the echo to echo space 1 for the echo trains according to the invention with which MR data are acquired for an Out of Phase Image.

Figure 3:
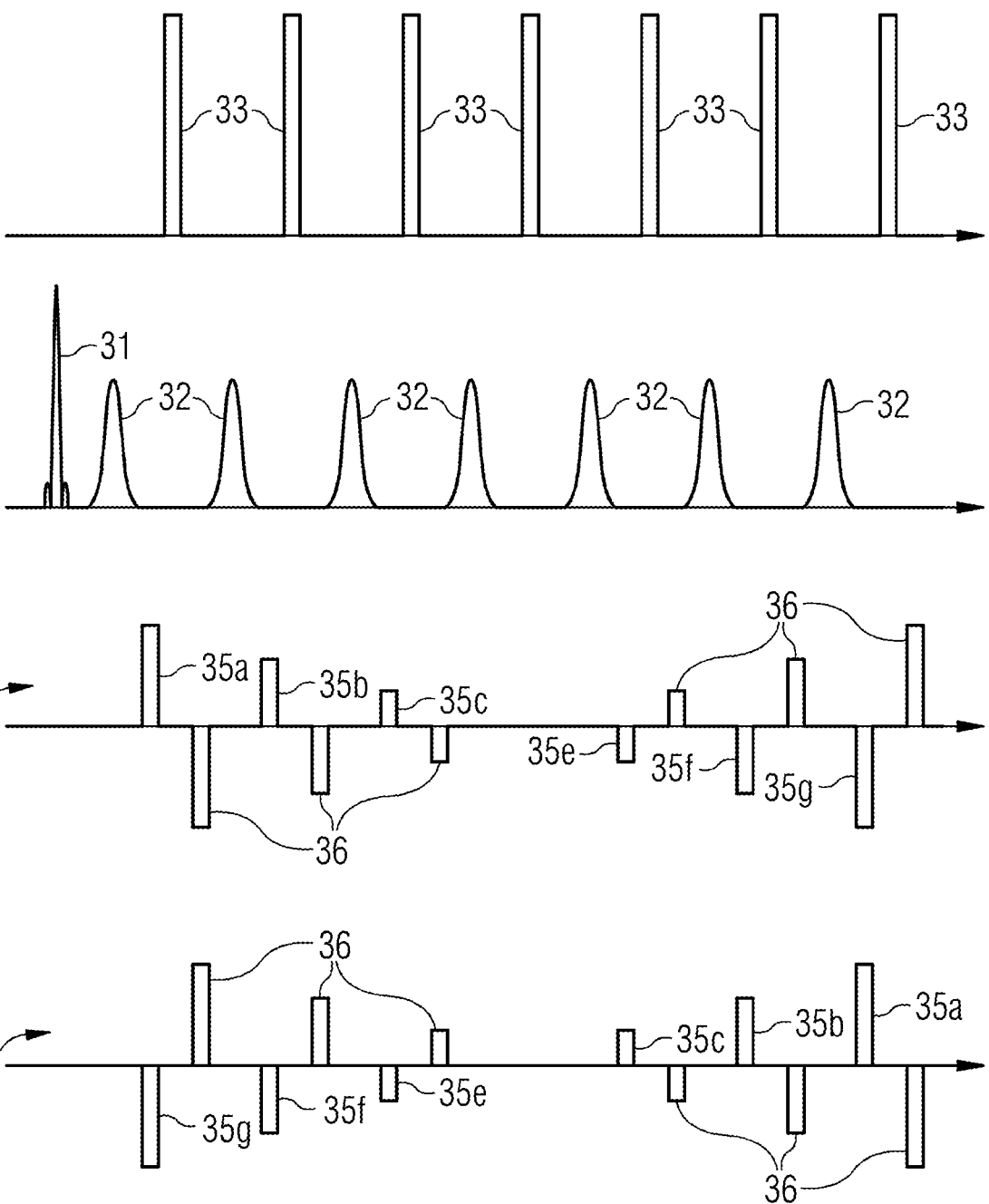
FIG. 3 shows a sequence according to the invention for acquiring MR data, in which the sequence of gradient moments in the second echo train corresponds with a complete inversion of the sequence of gradient moments in the first echo train.

FIG. 3 likewise shows an echo train according to the invention. Here, the line marked with the reference sign 61 shows the phase-encoding gradients in the phase-encoding direction or y-direction that are applied to acquire MR data for an In Phase Image (Out of Phase Image), while the line marked with the reference sign 62 shows the phase-encoding gradients that are applied to acquire MR data for an Out of Phase Image (In Phase Image). In other words, it is important that the gradient moments of the phase-encoding gradient of the first echo train, with which MR data is acquired for an In Phase Image (Out of Phase Image), correspond with a sequence that corresponds with an at least partial inversion of a further sequence that applies for the gradient moments of the phase-encoding gradient of the second echo train, with which MR data is acquired for an Out of Phase Image (In Phase Image).

It has been realized that the sequence of gradient moments 35$a$, 35$b$, . . . , 35$g$ for acquiring the MR data for the In Phase Image (reference sign 61) decreases in a linear manner (for example, +30, +20, +10, 0, −10, −20, −30), while the sequence of gradient moments 35$g$, 35$f$, . . . , 35$a$ for acquiring the MR data for the Out of Phase Image (reference sign 62) increases in a linear manner (for example, 30, 20, 10, 0, +10, +20, +30). The first gradient moment 35$g$ in the sequence of gradient moments for acquiring the MR data for the Out of Phase Image (reference sign 62) corresponds with the last gradient moment 35$g$ in the sequence of gradient moments for acquiring the MR data for the In Phase Image (reference sign 61). The second gradient moment 35$f$ in the sequence of gradient moments for acquiring the MR data for the Out of Phase Image (reference sign 62) corresponds with the penultimate gradient moment 35$f$ in the sequence of gradient moments for acquiring the MR data for the In Phase Image (reference sign 61). And so on. Thus the sequence of gradient moments for acquiring the MR data for the Out of Phase Image (reference sign 62) corresponds with a complete inversion of the sequence of gradient moments for acquiring the MR data for the In Phase Image (reference sign 61).

It should be noted that, for clarity, the ADC signals 33 are only shown once for the first and for the second echo train although the ADC signals 33 are chronologically located differently depending on whether MR data is acquired for the In Phase Image or for the Out of Phase Image, as explained in detail with reference to FIG. 2.

FIG. 4 shows the phase-encoding gradients in the phase-encoding direction or y-direction according to a different embodiment as per the invention. In this embodiment, the second sequence of gradient moments of the phase-encoding gradients for acquiring the MR data for an out of phase image does not correspond with a complete inversion of the first sequence of gradient moments of the phase-encoding gradients for acquiring the MR data for an In Phase Image, but only with a partial inversion. The first gradient moment 35$f$ in the second sequence corresponds with the penultimate gradient moment 35$f$ in the first sequence, the second gradient moment 35$e$ in the second sequence corresponds with the third to last gradient moment 35$e$ in the first sequence, the third gradient moment which has the value zero (hence without a reference sign) corresponds with the fourth to last gradient moment in the first sequence, and so on.

If, for example, the echo time does not correspond exactly with the central segment 44, in the echo trains the echoes or MR data cannot be acquired from one or a plurality of segments. In such cases, the MR image can be reconstructed using half Fourier or partial Fourier techniques.

Figure 5:
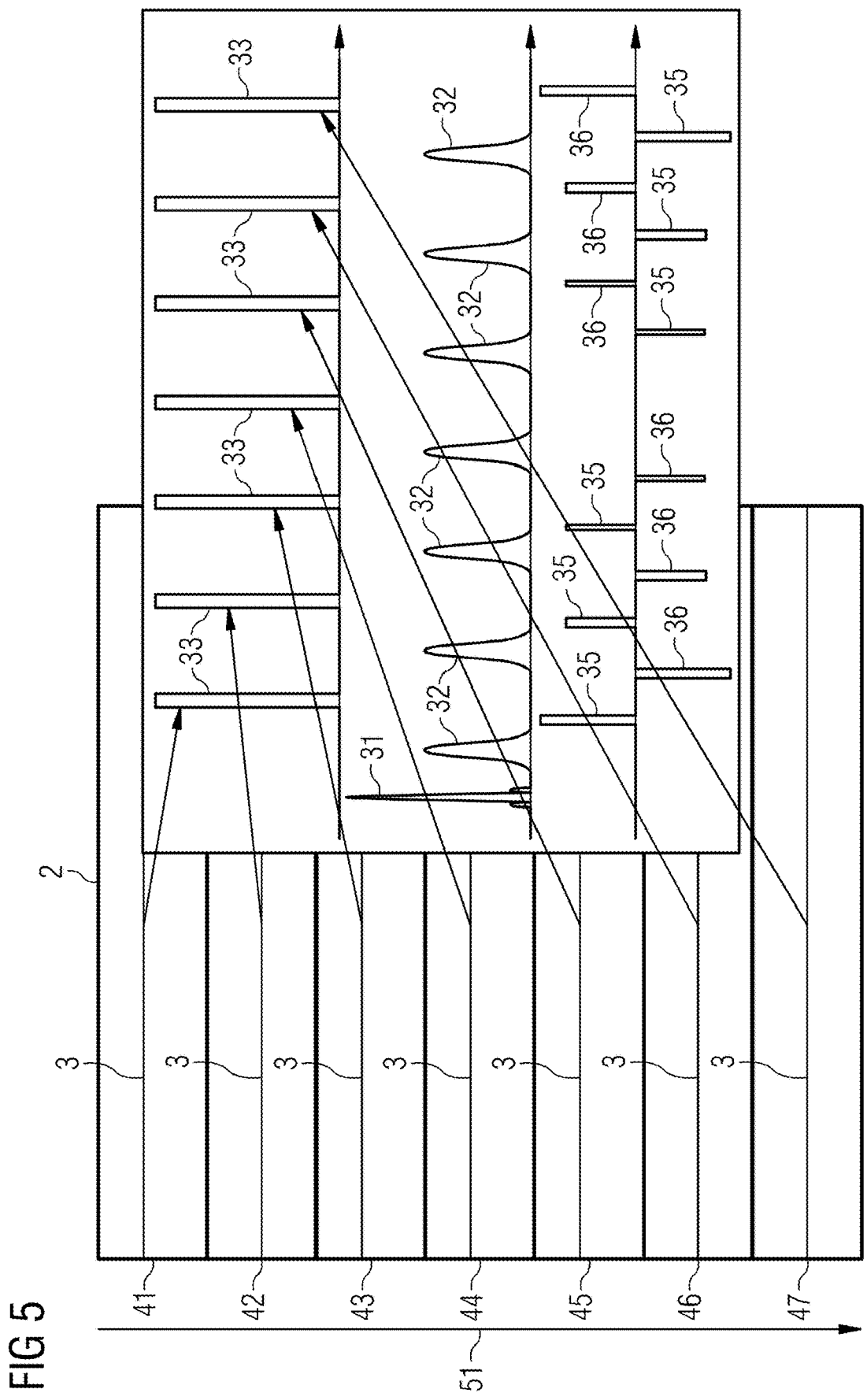
FIG. 5 shows, for an echo train according to the invention, which k-space lines are acquired.

FIG. 5 shows in schematic form how k-space 2 is scanned by an echo train according to the invention, assuming that, with the echo train that is shown, MR data is acquired for an In Phase Image such that the reference sign 51 denotes an In Phase selection direction.

The slice of k-space 2 that is to be scanned in each case is subdivided here into seven k-space segments 41-47. Each echo train acquires one k-space line 3 in each case from each of these k-space segments 41-47. Here, in the In Phase selection direction that is shown, MR data for a k-space line 3 is first acquired in the first segment 41, then MR data is acquired for a k-space line 3 in the second segment 42, then MR data for a k-space line 3 in the second segment 43, and so on. With the Out of Phase selection direction, which is not shown in FIG. 5, the sequence in which one k-space line 3 is acquired in each cases from the segments 41-47 is the exact opposite of the In Phase selection direction 51.

In the example shown, assuming that there is a total of 252 k-space lines for one slice, then there are 252/7=36 k-space lines per segment 41-47. A complete scan can therefore be carried out with 36 echo trains in the In Phase selection direction 51 and 36 echo trains in the Out of Phase selection direction 52.

Figure 6:
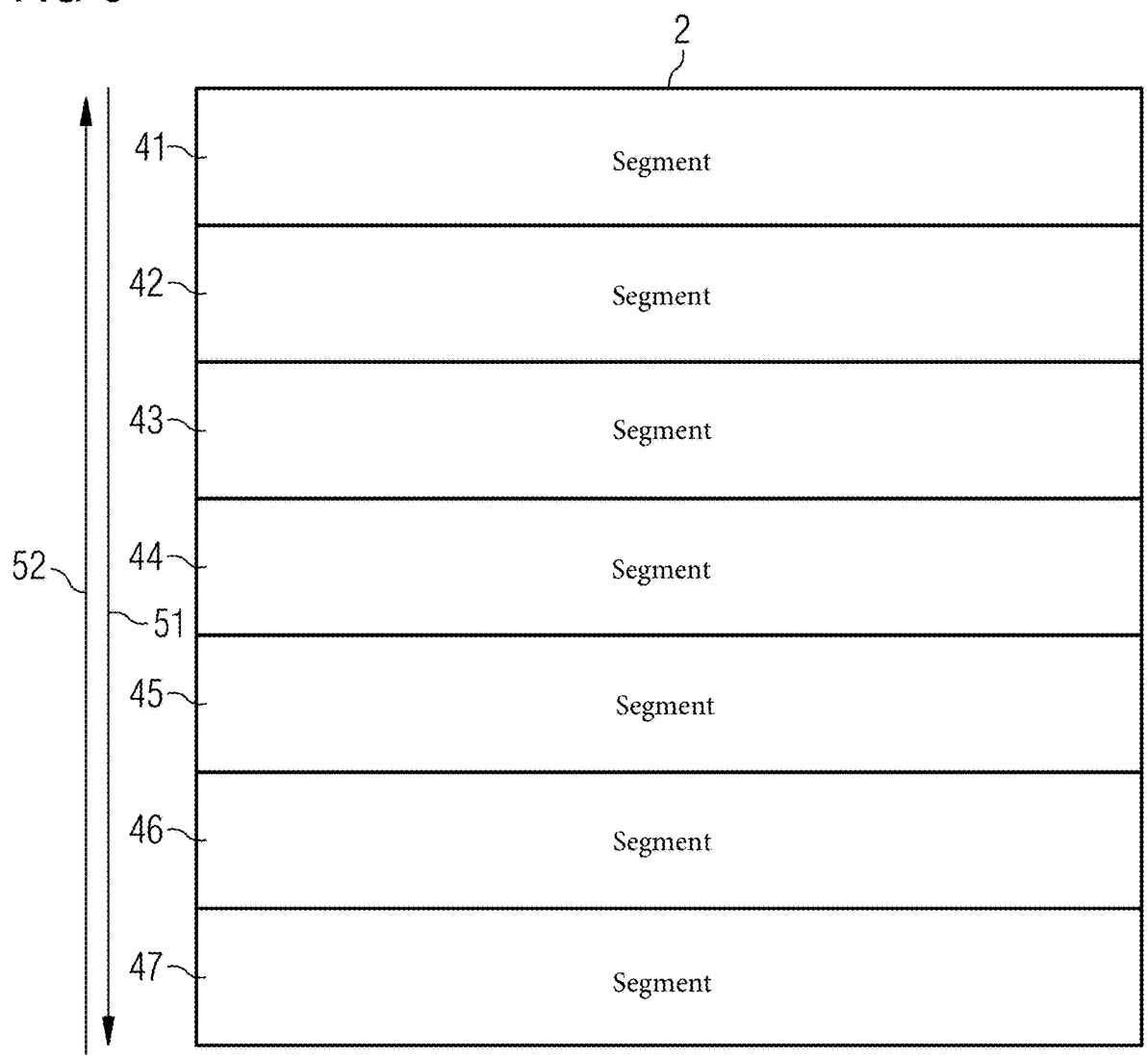
FIG. 6 shows according to the invention, in which sequence k-space is scanned by a first and by a second echo train in the case of a complete inversion.

The In Phase selection direction 51 and the Out of Phase selection direction 52 are shown together in FIG. 6. The embodiment shown in FIG. 6 is a case of complete inversion because both the echo train that acquires the MR data in the In Phase selection direction 51 and the echo train that acquires the MR data in the Out of Phase selection direction 52 each scan one k-space line 3 in each segment 41-47. This means the sequence of gradient moments of the phase-encoding gradient (in the phase-encoding direction) of the second echo train corresponds with a complete inversion of the sequence of gradient moments of a phase-encoding gradient (in the phase-encoding direction) of the first echo train.

Figure 7:
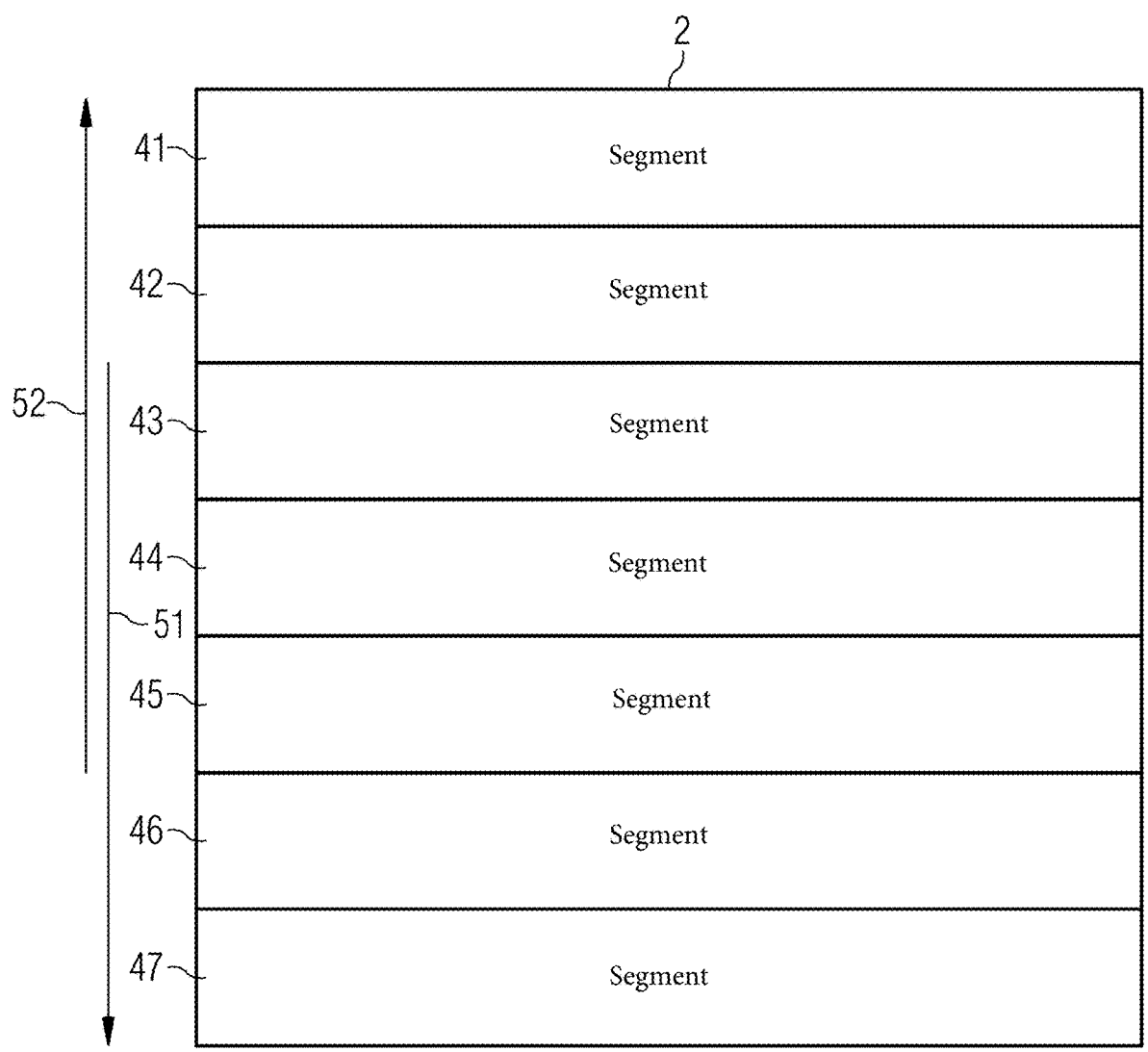
FIG. 7 shows according to the invention, in a similar manner to FIG. 6, in which sequence k-space is scanned by a first and by a second echo train in the case of an incomplete or partial inversion.

FIG. 7 on the other hand shows a partial inversion. The echo train that acquires the MR data in the In Phase selection direction 51 acquires k-space lines 3 only in the five segments 43-47. The echo train that acquires the MR data in the Out of Phase selection direction 52 acquires k-space lines 3 only in the five segments 45-41.

In the embodiment illustrated in FIG. 6, the two echo trains that operate along the In Phase selection direction 51 or the Out of Phase selection direction 52 each acquire exactly the same k-space lines only in a precisely reverse order. On the other hand, in the embodiment illustrated in FIG. 7, the two echo trains that operate along the In Phase selection direction 51 or the Out of Phase selection direction 52 acquire the same k-space lines 3 only in the three segments 43-45. The two k-space lines from the segments 41, 42 are acquired only by the echo train operating in the Out of Phase selection direction 52 at the end of the echo train, while the two k-space lines from the segments 46, 47 are likewise only acquired by the echo train operating in the In Phase selection direction 51 at the end of this echo train.

FIG. 8 shows a flowchart for the method according to the invention.

In the first step S1, using a first echo train, which has a specific phase-encoding pattern, "In Phase echoes" (echoes or MR data, in which the spins of the two substances are in phase) are acquired. In the second step S2, which can be carried out before or after the first step S1, Out of Phase echoes (echoes or MR data, in which the spins of one of the two substances differ in their phase by 180° from the spins of the other of the two substances) are acquired using a second echo train. Here the second echo train has a phase-encoding pattern (sequence of gradient moments of the phase-encoding gradient), which is at least partly inverted compared with the phase-encoding pattern of the first echo train. In the third step S3, on the basis of the In Phase echoes and the Out of Phase echoes an MR image is reconstructed, in which the water signal or the fat signal is suppressed. This means that with the two predetermined substances, using which the In Phase condition (spins of the first substance (water) and of the second substance (fat) are in phase) and the Out of Phase condition (spins of the first substance (water) and of the second substance (fat) have a phase difference of 180°) are determined, are water and fat.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) data using an MR data acquisition scanner comprising a radio-frequency (RF) antenna arrangement and a gradient coil arrangement, said method comprising:
   generating control signals in a computer and providing said control signals from said computer to said MR data acquisition scanner so as to acquire first MR data from a predetermined volume of a subject, by exciting nuclear spins of two predetermined substances in said predetermined volume and by operating said gradient coil arrangement so as to acquire said first MR data during a first echo train at respective time intervals during which the nuclear spins of said two predetermined substances occur in phase;
   phase encoding said first MR data by operating said gradient coil arrangement so as to produce a phase-encoding gradient during said first echo train comprising gradient moments in one phase-encoding direction in a first predetermined sequence;
   operating said MR data acquisition scanner from said computer with said control signals so as to acquire second MR data during a second echo train, by operating said gradient coil arrangement so as to acquire said second MR data during said second echo train at respective time intervals during which the nuclear spins of said two predetermined substances differ in phase by 180°;
   with said control signals, operating said gradient coil arrangement during acquisition of said second MR data so as to produce a phase-encoding gradient having gradient moments also in said one phase-encoding direction, with a second predetermined sequence;
   operating said gradient coils during the acquisition of said first MR data and during the acquisition of said second MR data with said control signals so that said second sequence is an inversion of at least a portion of said first sequence so that a first gradient moment in said second sequence corresponds to an $n^{th}$ gradient moment in said first sequence, and so that a second gradient moment in said second sequence corresponds to an $(n-1)^{th}$ gradient moment in said first sequence, with n being less than or equal to a length of each of said first echo train and said second echo train; and
   in said computer, reconstructing an MR image of said predetermined volume from said first MR data and said second MR data, and making said reconstructed image available in electronic form, as a data file, from said computer.

2. The method as claimed in claim 1, comprising:
   entering each of said first MR data and said second MR data into a memory organized as k-space and subdividing k-space in said memory into segments, with each segment having a dimension in a selection gradient direction, defined by a selection gradient produced by said gradient coil arrangement with said control signals, corresponding to a dimension of k-space in said selection gradient direction; and
   operating said MR data acquisition scanner so that at least one of said first echo train and said second echo train does not produce an echo in each of said segments.

3. The method as claimed in claim 1, comprising:
   operating said MR data acquisition scanner with said control signals so that said second sequence is a complete inversion of said first sequence, thereby producing a correspondence between the respective gradient moments of the first sequence and the respective gradient moments of the second sequence,
   wherein the first gradient moment in the second sequence corresponds to a last moment in said first sequence, and
   wherein a second gradient moment in said second sequence corresponds with a penultimate gradient moment in said first sequence, with all other gradient moments in said first and second sequence having a correspondence that follows therefrom.

4. The method as claimed in claim 1, comprising:
   operating said MR data acquisition scanner so as to radiate RF pulses with said RF antenna arrangement that excite nuclear spins in water and fat as said two predetermined substances.

5. The method as claimed in claim 1, comprising:
   operating said MR data acquisition scanner with said control signals so as to produce, with said gradient coil arrangement, a same further phase-encoding gradient during each of said first echo train and said second echo train, and entering the first and second MR data into a memory organized as k-space according to said phase-encoding gradient and said further phase-encoding gradient so that said first MR data and said second MR data respectively fill a portion of same lines in k-space.

6. The method as claimed in claim 1 comprising:
   operating said MR data acquisition scanner with said control signals so as to produce slice selection gradients with said gradient coil arrangement that cause said first and second MR data to be acquired with a same slice selection; and
   entering said first and second MR data into a memory organized as k-space with said first and second MR data being entered into the same lines in k-space.

7. The method as claimed in claim 1, comprising:
   operating said MR data acquisition scanner so that said first echo train has a same echo-to-echo spacing as said second echo train.

8. A magnetic resonance (MR) apparatus comprising:
an MR data acquisition scanner comprising a radio-frequency (RF) antenna arrangement and a gradient coil arrangement;
a computer configured to generate control signals and to provide said control signals from said computer to said MR data acquisition scanner so as to acquire first MR data from a predetermined volume of a subject, by exciting nuclear spins of two predetermined substances in said predetermined volume and by operating said gradient coil arrangement so as to acquire said first MR data during a first echo train at respective time intervals during which the nuclear spins of said two predetermined substances occur in phase;
said computer being configured to operate said MR data acquisition scanner with said control signals so as to phase encode said first MR data by operating said gradient coil arrangement in order to produce a phase-encoding gradient during said first echo train comprising gradient moments in one phase-encoding direction in a first predetermined sequence;
said computer being configured to operate said MR data acquisition scanner with said control signals so as to acquire second MR data during a second echo train, by operating said gradient coil arrangement in order to acquire said second MR data during said second echo train at respective time intervals during which the nuclear spins of said two predetermined substances differ in phase by 180°;
said computer being configured to operate said gradient coil arrangement with said control signals during acquisition of said second MR data so as to produce a phase-encoding gradient having gradient moments also in said one phase-encoding direction, with a second predetermined sequence;
said computer being configured to operate said gradient coils with said control signals during the acquisition of said first MR data and during the acquisition of said second MR data so that said second sequence is an inversion of at least a portion of said first sequence so that a first gradient moment in said second sequence corresponds to an $n^{th}$ gradient moment in said first sequence, and so that a second gradient moment in said second sequence corresponds to an $(n-1)^{th}$ gradient moment in said first sequence, with n being less than or equal to a length of each of said first echo train and said second echo train; and
said computer being configured to reconstruct an MR image of said predetermined volume from said first MR data and said second MR data, and to make said reconstructed image available in electronic form, as a data file, from said computer.

9. A non-transitory, computer-readable data storage medium encoded with programming instructions, said storage medium being loaded into a computer system of a magnetic resonance (MR) apparatus having an MR data acquisition scanner comprising a gradient coil arrangement and a radio-frequency (RF) antenna arrangement, said programming instructions causing said computer to:
generate control signals in a computer and provide said control signals from said computer to said MR data acquisition scanner so as to acquire first MR data from a predetermined volume of a subject, by exciting nuclear spins of two predetermined substances in said predetermined volume and by operating said gradient coil arrangement so as to acquire said first MR data during a first echo train at respective time intervals during which the nuclear spins of said two predetermined substances occur in phase;
phase encode said first MR data by operating said gradient coil arrangement so as to produce a phase-encoding gradient during said first echo train comprising gradient moments in one phase-encoding direction in a first predetermined sequence;
operate said MR data acquisition scanner from said computer with said control signals so as to acquire second MR data during a second echo train, by operating said gradient coil arrangement so as to acquire said second MR data during said second echo train at respective time intervals during which the nuclear spins of said two predetermined substances differ in phase by 180°;
with said control signals, operate said gradient coil arrangement during acquisition of said second MR data so as to produce a phase-encoding gradient having gradient moments also in said one phase-encoding direction, with a second predetermined sequence;
operate said gradient coils during the acquisition of said first MR data and during the acquisition of said second MR data with said control signals so that said second sequence is an inversion of at least a portion of said first sequence so that a first gradient moment in said second sequence corresponds to an $n^{th}$ gradient moment in said first sequence, and so that a second gradient moment in said second sequence corresponds to an $(n-1)^{th}$ gradient moment in said first sequence, with n being less than or equal to a length of each of said first echo train and said second echo train; and
reconstruct an MR image of said predetermined volume from said first MR data and said second MR data, and make said reconstructed image available in electronic form, as a data file, from said computer.

10. The method as claimed in claim 1, wherein the first sequence includes a set of first gradient moments that correspond to an in phase image and decrease in a linear manner over time, and
wherein the second sequence includes a set of second gradient moments that correspond to an out of phase image and increase in a linear manner over time.

11. The method as claimed in claim 1, wherein the first echo train and the second echo train have the same gradient moment with regard to area and algebraic sign.

* * * * *